US011751336B2

(12) United States Patent
Landa et al.

(10) Patent No.: US 11,751,336 B2
(45) Date of Patent: *Sep. 5, 2023

(54) METHOD FOR APPLYING A PATTERN TO A SUBSTRATE

(71) Applicant: LUMET TECHNOLOGIES LTD., Rehovot (IL)

(72) Inventors: Benzion Landa, Nes Ziona (IL); Haim Touitou, Jerusalem (IL); Stanislav Thygelbaum, Bat Yam (IL); Naomi Elfassy, Jerusalem (IL)

(73) Assignee: LUMET TECHNOLOGIES, LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,551

(22) Filed: Nov. 28, 2022

(65) Prior Publication Data

US 2023/0087822 A1    Mar. 23, 2023

Related U.S. Application Data

(63) Continuation of application No. 17/060,078, filed on Oct. 1, 2020, now Pat. No. 11,546,999, which is a
(Continued)

(30) Foreign Application Priority Data

Jul. 28, 2016  (GB) ..................................... 1613051
Jun. 14, 2017  (GB) ..................................... 1709427

(51) Int. Cl.
*H05K 3/20*    (2006.01)
*H05K 3/38*    (2006.01)
(Continued)

(52) U.S. Cl.
CPC ............... *H05K 3/207* (2013.01); *B41M 1/12* (2013.01); *H01L 31/02167* (2013.01);
(Continued)

(58) Field of Classification Search
CPC ............... B41M 1/12; H01L 31/02167; H01L 31/022425; H01L 31/022433;
(Continued)

(56) References Cited

U.S. PATENT DOCUMENTS 10,834,824 B2 * 11/2020 Landa .................... H01L 31/206
11,546,999 B2 *  1/2023 Landa ....................... B41M 1/12

OTHER PUBLICATIONS

English translation of CN11074137.*
(Continued)

*Primary Examiner* — Sonya M Sengupta
(74) *Attorney, Agent, or Firm* — Shalom Wertsberger; Saltamar Innovations (57) ABSTRACT

An apparatus is disclosed for transferring a pattern of a composition containing particles of an electrically conductive material and a thermally activated adhesive from a surface of a flexible web to a surface of a substrate. The apparatus comprises:
  respective drive mechanisms for advancing the web and the substrate to a nip through which the web and the substrate pass at the same time and where a pressure roller acts to press the surfaces of the web and the substrate against one another,
  a heating station for heating at least one of the web and the substrate prior to, or during, passage through the nip, to a temperature at which the adhesive in the composition is activated,
  a cooling station for cooling the web after passage through the nip, and
(Continued)

a separating device for peeling the web away from the substrate after passage through the cooling station, to leave the pattern of composition adhered to the surface of the substrate.

21 Claims, 3 Drawing Sheets

Related U.S. Application Data continuation of application No. 16/258,892, filed on Jan. 28, 2019, now Pat. No. 10,834,824, which is a continuation-in-part of application No. PCT/IB2017/054632, filed on Jul. 28, 2017.

(51) Int. Cl.
    *B41M 1/12*     (2006.01)
    *H01L 31/0224*     (2006.01)
    *H05K 3/34*     (2006.01)
    *H05K 1/03*     (2006.01)
    *H05K 1/09*     (2006.01)
    *H01L 31/0216*     (2014.01)
    *H01L 31/0392*     (2006.01)
    *H01L 31/20*     (2006.01)
    *H05K 1/16*     (2006.01)

(52) U.S. Cl.
    CPC ............ *H01L 31/022425* (2013.01); *H01L 31/022433* (2013.01); *H01L 31/03926* (2013.01); *H01L 31/206* (2013.01); *H05K 1/0393* (2013.01); *H05K 1/092* (2013.01); *H05K 3/3485* (2020.08); *H05K 3/386* (2013.01); *H05K 1/165* (2013.01); *H05K 2201/0195* (2013.01); *H05K 2201/035* (2013.01); *H05K 2201/0338* (2013.01); *H05K 2201/0391* (2013.01); *H05K 2201/10098* (2013.01); *H05K 2203/0139* (2013.01); *H05K 2203/1105* (2013.01); *H05K 2203/1131* (2013.01); *H05K 2203/1476* (2013.01); *H05K 2203/1545* (2013.01); *Y02E 10/50* (2013.01)

(58) Field of Classification Search
    CPC ............ H01L 31/03926; H01L 31/206; H05K 1/0284; H05K 1/0393; H05K 1/092; H05K 1/165; H05K 2201/0195; H05K 2201/0338; H05K 2201/035; H05K 2201/0391; H05K 2201/10098; H05K 2203/0139; H05K 2203/1105; H05K 2203/1131; H05K 2203/1476; H05K 2203/1545; H05K 3/207; H05K 3/3485; H05K 3/386
See application file for complete search history.

(56)     References Cited

OTHER PUBLICATIONS

English translation of CN101088140.*
English translation of KR20130033851.*
English translation of WO2012161517.*

* cited by examiner

METHOD FOR APPLYING A PATTERN TO A SUBSTRATE

CROSS-REFERENCE TO RELATED APPLICATIONS

This application is a continuation of U.S. application Ser. No. 17/060,078 filed on Oct. 1, 2020, which is a continuation of U.S. application Ser. No. 16/258,892 filed on Jan. 28, 2019, which is a Continuation-In-Part (CIP) of International Application No. PCT/IB2017/054632, filed on Jul. 28, 2017, which claims priority from Great-Britain Patent Application No. GB1613051.0 filed on Jul. 28, 2016, and from Great-Britain Patent Application No. GB1709427.7, filed on Jun. 14, 2017. This application is related to U.S. application Ser. No. 17/151,664 filed on Jan. 19, 2021, which is a divisional of U.S. application Ser. No. 16/258,808 filed on Jan. 28, 2019, titled "Application of Electrical Conductors of a Solar Cell" which claims priority from International Application No. PCT/IB2017/054626 filed on Jul. 28, 2017, and is a CIP application thereof. This application is also related to U.S. application Ser. No. 17/132,472 filed on Dec. 23, 2020, which is a continuation of U.S. application Ser. No. 16/831,794 filed on Mar. 26, 2020, which is a divisional application of U.S. application Ser. No. 16/258,851 filed on Jan. 28, 2019, titled "Application of Electrical Conductors to an Electrically Insulating Substrate" which claims priority from International Application No. PCT/IB2017/054629 filed on Jul. 28, 2017, and is a CIP application thereof. The entire disclosures of all the aforementioned applications are incorporated by reference herein for all purposes as if fully set forth herein.

FIELD

The present disclosure relates to an apparatus for transferring a pattern of a composition containing particles of an electrically conductive material and an adhesive from a surface of a flexible web to a surface of a substrate.

BACKGROUND

In the manufacture of solar cells, circuit boards, and radio frequency identification (RFID) antennas, amongst other items, there is a need to apply an electrically conductive pattern to a surface of a substrate. The substrate may be a semiconductor wafer in the case of a solar cell, or an electrically insulating board, in the case of a printed circuit. While such substrates are typically rigid and planar, flat flexible substrates having according properties may also be used. In some cases, for example an RFID device, it may be desired to print a conductive pattern directly onto a three-dimensional item, such as part of the body of a piece of equipment, and the surface onto which the conductive pattern is to be applied may be flat or curved.

Various methods are well known for applying electrically conductive patterns to substrates. Generally, the conductive pattern is formed directly on the substrate. In some cases, it is achieved by selective deposition of a conductive material and, in others, by coating the entire surface of the substrate with a conductive material, then selectively removing the material, such as by etching or laser ablation, to leave the desired pattern. Each of the known methods has its own advantages and disadvantages.

The present Applicant has devised and described in separate patent applications (PCT/IB2017/054626 and PCT/IB2017/054629) filed on the same day as the present application a method of applying conductors to a substrate in which the pattern from which the conductors are formed is not created directly on the substrate but on a separate web. A flexible web is provided with a pattern of grooves matching the desired pattern of the conductors. The grooves are filled with a composition that contains electrically conductive particles (e.g., made of metals, alloys, organo-metals, conductive polymers, and the like) and an adhesive. The composition is transferred from the web (namely, from the grooves) to the substrate and is then sintered to render it electrically conductive. For simplicity, the adhesive which can be thermally-, and optionally further pressure-, activated during transfer of the patterned composition to the substrate can be referred to herein as a "thermally activated" adhesive, even prior to any suitable "activation" allowing the adhesive to bind the conductive particles, so as to maintain the groove-derived shape of the composition, and/or facilitating the adhesion of the transferred composition to the substrate.

SUMMARY

With a view to enabling efficient implementation of the Applicants' method, the present disclosure provides an apparatus for transferring a pattern of a composition containing particles of an electrically conductive material and a thermally activated adhesive from a surface of a flexible web to a surface of a substrate, which apparatus comprises:
respective drive mechanisms for advancing the web and the substrate to a nip through which the web and the substrate pass at the same time and where a pressure roller acts to press the surfaces of the web and the substrate against one another,
a heating station for heating at least one of the web and the substrate prior to, or during, passage through the nip, to a temperature at which the adhesive in the composition is activated,
a cooling station for cooling the web after passage through the nip, and
a separating device for peeling the web away (or in other words, stripping the web off) from the substrate after passage through the cooling station, to leave the pattern of composition adhered to the surface of the substrate.

The web may carry a plurality of patterns, spaced from one another along the length of the web, for transfer of each pattern onto a respective one of a plurality of substrates. The web may be produced in one location and transported to another, where the apparatus of the present disclosure can be used to transfer the patterns to multiple substrates. Separation of the production of the patterns from their transfer to the substrates allows both processes to be separately automated and optimized.

While in some embodiments, the composition can be on (i.e. above) the surface of the flexible web, for instance when flat electrodes are desired, in other instances the composition may be in grooves formed within the flexible web. In such a case, preferred when the pattern of conductors due to result from such a process includes conductive lines having a specific cross-sectional profile (e.g., having tapering faces), the composition is substantially level with the surface of the flexible web. As used herein, when a pattern of a composition containing particles of an electrically conductive material and an adhesive is said to be transferred from a surface of a flexible web, both afore-said localizations of the pattern, above or within the web, are encompassed. In a preferred embodiment, the pattern of the composition substantially fills grooves formed with the flexible web, level with the surface.

In some embodiments, the drive mechanism for the web comprises a web supply roll, a web take-up roll, drive rollers for continuously driving the web from the supply roll to the take-up roll via the nip, and optionally a web guide; and the substrate drive mechanism comprises a stack of substrates and an indexing mechanism for feeding substrates individually from the stack to the nip in synchronism with the movement of the web.

The substrate indexing mechanism may comprise an alignment device with abutments for ensuring correct alignment of edges of the substrate along mutually orthogonal axes. In some embodiments, at least one of such abutments can be displaceable. By way of non-limiting example an abutment can be positioned upstream of the nip on the path of the substrate (i.e., blocking its leading edge). Such an alignment element can be displaced following suitable alignment to allow the aligned substrate to proceed to the nip, it may be retracted below level of substrate path or can be lifted above substrate height or otherwise moved out of the way of the substrate.

In some embodiments, the substrate indexing mechanism includes an analyzer for detecting defects in substrates drawn from the stack and an ejector for rejecting substrates found to contain defects. While it is desirable to detect and reject defects upstream of the nip, ahead of transfer, in some embodiments, the apparatus further comprises an analyzer for detecting defects in transferred patterns and an ejector for rejecting substrates found to contain such defects downstream of the nip and upstream of discharge.

To ensure correct positioning of each pattern relative to reference edges of the surface of the substrate, the drive mechanism of the web may include a sensor for detecting the position of patterns (or parts thereof) on the web and a dancer roller to enable the speed and/or tension of the web relative to the nip to be increased or decreased.

In some embodiments, the apparatus transfers a first pattern of a first composition from a surface of a single first flexible web only to a first surface of a substrate, so that the correct positioning of each first pattern on the first web relative to reference edges of the surface of the substrate is only required with respect to the first surface. In other embodiments, the apparatus transfers a first pattern of a first composition from a surface of a first flexible web to a first surface of a substrate and a second pattern of a second composition from a surface of a second flexible web to a second surface of the substrate opposite the first surface. In such a case, the correct positioning shall be of the first pattern on the first web relative to the first surface of the substrate and of the second pattern of the second web relative to the second surface of the substrate. In a particular case, the apparatus transfers the first pattern on the first surface of the substrate, while at the same time transferring the second pattern on the second surface of the same substrate (i.e., simultaneously).

Various approaches may be adopted to cool the web in the web cooling station. In one approach, the web may be cooled by conduction by being brought into thermal contact with an endless cooling belt. The cooling belt, which may be made of a silicone material, may itself be cooled by blowing air onto it or by any other suitable method known to the skilled person.

In an alternative approach, the web may be cooled by convection, by providing an air blower in the cooling station for blowing air onto the web after passage through the nip. In this case, the air may be cooled to a temperature of at most 20° C.

In an alternative approach, the web may be cooled by conduction by being brought into thermal contact with a heat sink. For example, the heat sink may extend between the nip and the separating device. There may be one or more rollers to ensure contact between the web and the heat sink. In some embodiments, the roller(s) may additionally act as a portion of the heat sink. For instance, such rollers may optionally be liquid cooled.

The approaches may cool the web so that the web reaches the separating device at a particular temperature, so as to facilitate the separation of the web away from the substrate and/or the adhesion of the pattern of composition to the surface of the substrate. Without wishing to be bound by any particular theory, it is believed that peeling the web from the substrate at a temperature below the softening temperature of the web and below the softening temperature of the composition (e.g., the softening temperature of polymers comprised in the composition, for instance the thermally activated adhesive) may assist these processes. For example, the temperature of the web following cooling and upon separation can be at most 60° C., at most 50° C., or at most 40° C.

As the composition is not itself conductive, the apparatus may further comprise a sintering station wherein sufficient energy is applied to sinter the electrically conductive material in order to render electrically conductive the pattern transferred to the substrate.

Different sintering methods exist, including thermal sintering, light induced sintering, microwave sintering, electrical sintering and chemical sintering, the elected sintering method being dependent upon the composition and preferred process conditions. The optional sintering station of the present apparatus can accordingly implement any desired sintering method.

In one embodiment, the sintering station, when present, is a heat sintering station, able to sinter the electrically conductive particles at a sintering temperature in the range of from about 100° C. to about 800° C., or more if the substrate and the composition can withstand higher temperatures. As readily appreciated by persons skilled in the art of sintering, heat sintering can be performed by raising the temperature of the composition containing the particles to be sintered at a constant-rate of heating or in rate-controlled steps, by methods and/or according to heating profiles which need not be detailed herein.

In some situations, it is necessary to perform at least one further process on the substrate prior to its discharge from the apparatus. For example, when manufacturing a solar cell, the composition, after sintering, may need to be heated to a higher temperature (e.g., from about 500° C. to about 900° C.) to cause the conductors to fuse with the semiconductor material and thereby lower the contact resistance. As a further example, when manufacturing a RFID assembly, the RFID antenna, after sintering, may need a protective coating.

The apparatus may include one or more finishing stations to perform such operations so that the substrates will be in their desired final state on being discharged from the apparatus.

Though it is possible to heat the web upstream of the nip, in some embodiments, the heating station is a substrate heating station for heating only the substrate. For example, the substrate may be heated to about 150° C. upstream of the nip. Substrate heating can be achieved in any suitable heating manner (e.g., by conduction, convection or radiation). Heating the web and/or the substrate upstream of the nip may obviate any heating of the nip or may allow for heating the nip to a temperature lower than would have been necessary in the absence of any pre-heating of the web and/or substrate. For instance, if the substrate were to be heated upstream of the nip to 150° C., then the nip could be heated to 60° C.; whereas the nip may have been required to have been heated instead to 160° C., were the substrate to enter the nip at ambient temperature (circa 25° C.). When the heating station includes heating of the substrate upstream of the nip to a given temperature, the additional heating of the pressure roller to a lower temperature, if effected, allows a reduction in the drop in temperature between the two heating steps. It is noted that for some particular uses of the apparatus, a drop in temperature that is too large for the particular uses of the apparatus (e.g., a drop from the given temperature to room temperature) could reduce or even prevent the transfer of a pattern from a web to a substrate.

When manufacturing certain items, for example solar cells, the substrate may be a flat plate (texturized or not texturized), wafer or film, and a conductive pattern may be required on its two surfaces. An embodiment for applying patterns of composition at the same time to opposite surfaces of a substrate may comprise two webs each having a respective drive mechanism and web cooling station, the nip being defined between two pressure rollers each serving to press a respective one of the webs against a respective surface of the substrate.

Other items may require non-planar substrates, in such a case the nip of the transferring station, for instance the substrate carrier and/or the pressure roller ensuring the proper contacting of the surfaces of the web and substrate, can be adapted to follow the contour of such non-planar substrates.

BRIEF DESCRIPTION OF THE DRAWINGS

The invention will now be described further, by way of example, with reference to the accompanying drawings, in which.

DETAILED DESCRIPTION

The ensuing description, together with the figures, makes apparent to a person having ordinary skill in the pertinent art how the teachings of the disclosure may be practiced, by way of non-limiting examples. The figures are for the purpose of illustrative discussion and no attempt is made to show structural details of an embodiment in more detail than is necessary for a fundamental understanding of the disclosure. For the sake of clarity and simplicity, some objects depicted in the figures may not be drawn to scale.

Overview of the Apparatus

Figure 1:
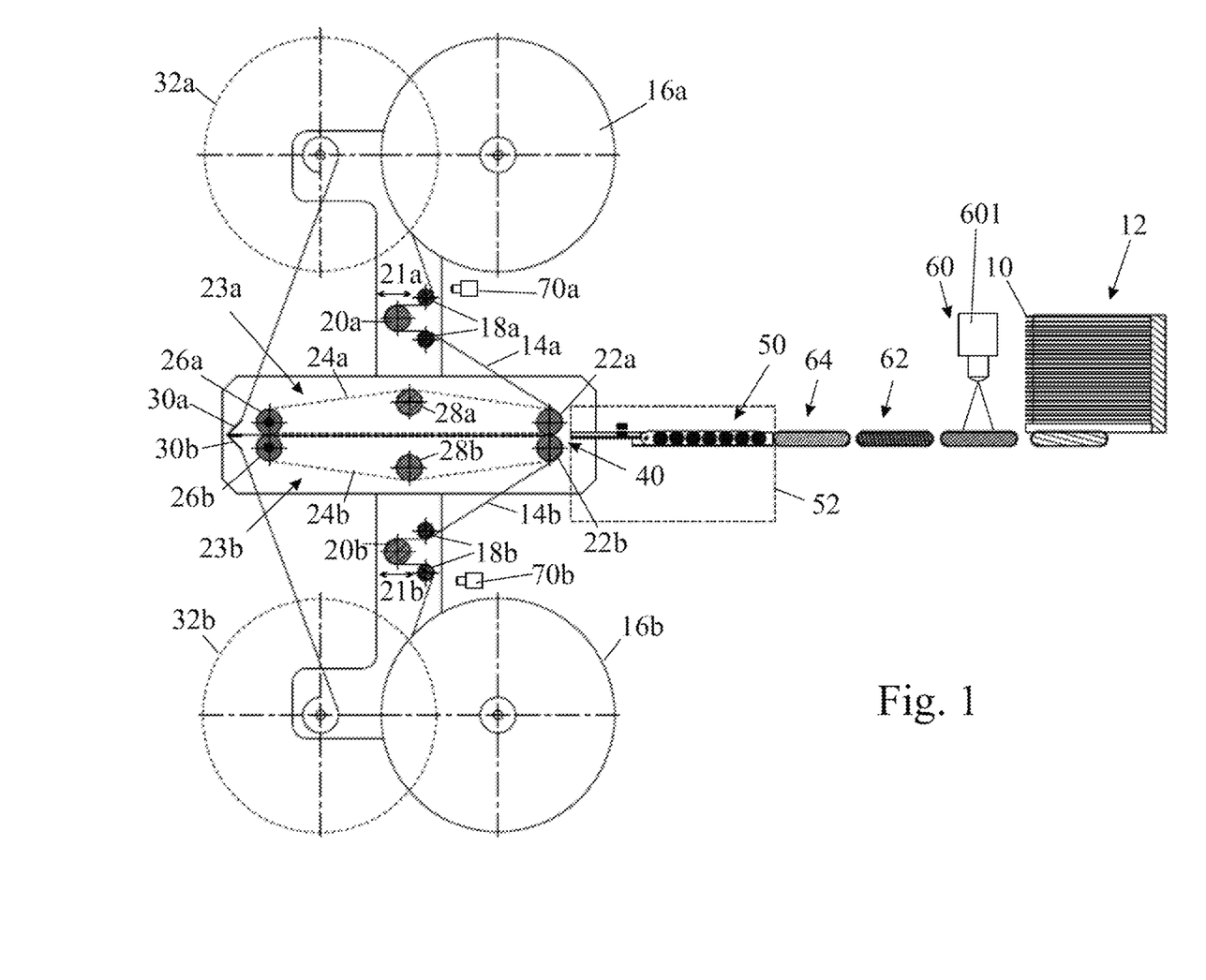
FIG. 1 is a schematic diagram of an embodiment of the present disclosure.
Figure 2:
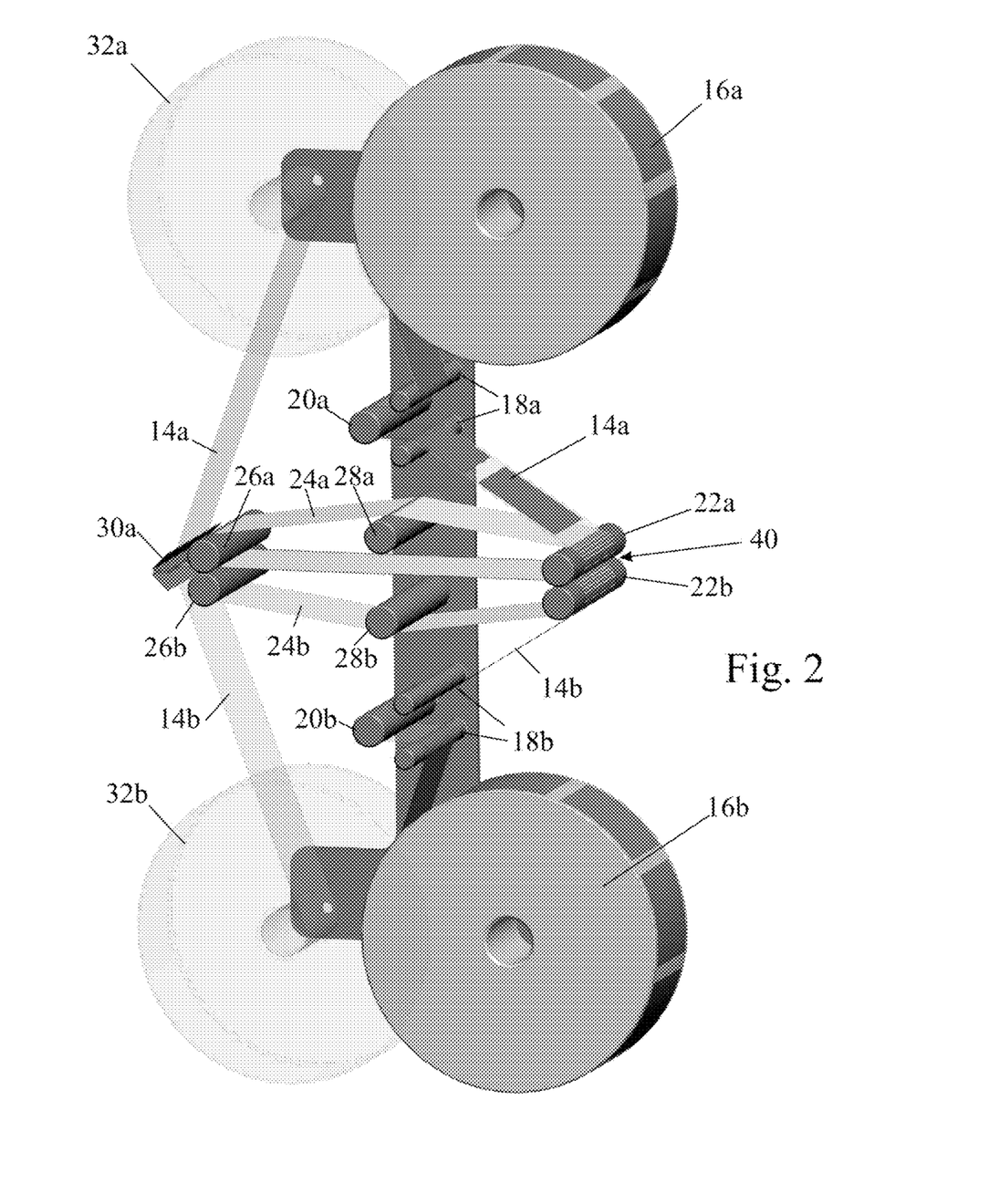
FIG. 2 is a perspective view of part of the embodiment of FIG. 1, showing only the path followed by the webs.

The apparatus of FIGS. 1 and 2 is intended to apply to opposite sides of substrates 10, drawn from a stack 12, patterns of a composition that contains electrically conducting particles and a thermally activated adhesive. The composition can be sintered by application of energy to render the patterns electrically conductive. Thus, in one example, the substrates 10 may be semiconductor wafers onto which the apparatus applies the front and back electrodes of the desired end-item. The two conductive patterns are usually not the same but may need to be correctly aligned with one another and with the substrate.

In the substrate drive mechanism, substrates 10 are dispensed one at a time from the stack 12 to an inspection station 60 where the upper surfaces of the substrates can be analyzed optically for defects. In the selection station 62 that follows, substrates found to be defective can be ejected. Substrates 10 without defects are advanced onto an alignment device 50 where they can, in one embodiment, also be heated by a heater 52. After being heated, if applied, and correctly positioned and oriented, the substrates 10 are fed into a nip 40 defined between two pressure rollers 22a and 22b.

While the inclusion of an inspection station 60 and a selection station 62 to detect and eject defective substrates is recommended, such stations are not essential for the operation of the apparatus, being only preferable from a quality control standpoint. Stations fulfilling similar roles downstream of the nip, and typically following the peeling of the flexible web, can optionally be further included to detect defective patterns and eject substrates bearing such defects.

In the event that the apparatus does comprise stations 60 and 62 upstream of the nip, it can be desired to further include an accelerating station 64 allowing a non-defective substrate being drawn after a defective one, which was therefore ejected, to reach the nip in synchronism with the pattern(s) of the web(s). Such accelerating station 64 may therefore prevent an "empty" feeding of the web at the nip, in absence of a substrate. Such an accelerating station is, however, not essential as such empty feeding can be tolerated or mitigated by alternative means, such as adding a substrate pre-selected as flawless from a buffer of such non-defective wafers, or by any like solution.

The patterns of composition that are to be transferred to the substrates are carried, in the embodiment illustrated in the figure, by two flexible webs 14a and 14b. As can clearly be seen from FIGS. 1 and 2, the drive mechanisms of the two webs 14a and 14b can be mirror images of one another. To avoid repetition, reference numerals without a suffix will be used in the present description to refer generically to components of both web drive mechanisms but suffixes "a" and "b" are used in the drawings to distinguish between the upper and lower drive mechanisms.

Each web 14 is drawn from a supply roll 16 by way of idler rollers 18 and a dancer 20, that can move from left to right as represented by an arrow 21. Optionally, there is a web guide (not shown), to guide flexible web 14, and thereby prevent lateral movement of flexible web 14. The web 14 then passes between the two pressure rollers 22 that define the nip 40 into which substrates are fed. Within the nip, the composition pattern on the web 14 is pressed against a surface of the substrate 10 resulting in the pattern of composition adhering to the substrate. The web then passes through a cooling station 23 and between two rollers 26 to a separating device 30. After separation from the substrate(s) 10 by the device 30, the web is rewound on a take-up roll 32. Optionally, there may be a dancer (not shown) between device 30 and take-up roll 32. If desired, the take-up 32 roll can be returned to the web supplier for recycling.

For the purpose of ensuring correct registration of the patterns of composition with the substrates, optical sensors 70 are positioned to sense the patterns on the web 14 upstream of the idler rollers 18.

While the figures schematically illustrate an apparatus allowing simultaneous transfer of two patterns onto respective opposite surface of the substrate, the skilled person can readily appreciate how a similar apparatus can be prepared to transfer patterns of composition on a single substrate side. In such a case, nip 40, for instance, can be formed between a single pressure roller 22 and a backing support for substrate 10. The backing support may be in motion to match a relative movement of the web.

To the extent the apparatus is simultaneously (or in other words, at the same time) transferring a first pattern of a first composition from a surface of a first flexible web to a first surface of a substrate and a second pattern of a second composition from a surface of a second flexible web to a second surface of the substrate opposite the first surface, it should be noted that the first pattern and second pattern, first composition and second composition, and/or first web and second web need not be the same.

Having given a general description of the apparatus, individual components and parts of the apparatus will now be described The Substrate Drive Mechanism The apparatus illustrated in the drawings is intended for use in the manufacture of solar cells where the substrate has the form of a square semiconductor wafer (e.g., 125×125 mm, or 156×156 mm), but before describing the drive mechanism in detail it should be made clear that its design will depend in practice on the nature of the substrate. If, in alternative embodiments, the substrate is itself flexible (e.g., flexboards for printed circuits), then the drive mechanism may resemble that of the web. If the substrate is a 3D article that is only to have a conductive pattern applied to one side, then the substrate drive mechanism may be a conveyor passing beneath a single pressure roller 22.

In the case of the illustrated embodiment, the substrate drive mechanism includes a cassette within which a stack 12 of individual substrates 10 are stored. It is noted that in various embodiments there may be one, or more than one, stack of individual substrates from which substrates may be dispensed one at a time, but for simplicity of description, one stack is described herein. By means of a conveyor belt, the substrates 10 are dispensed one at a time from the stack 12 to the inspection station 60 (e.g., for optical detection of defects) where they are viewed from above by a camera 601. The image from the camera can be analyzed by a computer programmed to detect defects and flaws, such as cracks. The selection station 62 that follows the inspection station 60 may include, by way of example, a solenoid operated deflector that is under the control of the image analysis computer and displaces faulty substrates off the conveyor into a waste receptacle. Only substrates without defects are then allowed to pass to the next station, where they can be heated and correctly aligned.

Heating and Alignment Station

As its name implies, this station serves two separate functions. First, it serves to heat, when preferred, the substrate 10 to a temperature that will activate the adhesive in the composition carried by the web 14 when it comes into contact with it. The appropriate temperature will depend on the nature of the composition and the adhesive and is discussed in more detail in the Applicant's co-pending patent application PCT/IB2017/054626 (published as WO 2018/020479) for flexible webs prepared by the methods taught therein. A person skilled in transfer of such compositions can readily appreciate how to implement similar principles to select a temperature adapted to any web suitable for use in the present apparatus.

The heating may take different forms, depending on the temperature to be reached and can be by conduction (the substrate coming into contact with a hot plate, that is heated by a circulating fluid, a resistive heating element or PTC resistors), by convection (blowing a heated gas onto the substrate) or by radiation (infra-red or microwave, depending on the nature of the substrate). When heating is performed by conduction, it may be desired to further include elements capable of maintaining the substrate in intimate contact with the hot plate (e.g., rollers forming a nip with the plate) to accelerate substrate heating to the desired temperature.

While heating can be performed upstream of the nip, separately heating at least one of the web and substrate surfaces, it can alternatively, and additionally, be performed at the nip. For instance, the pressure roller 22 may, in such embodiments, additionally serve as a heating roller.

Figures 3A, 3B, 3C:
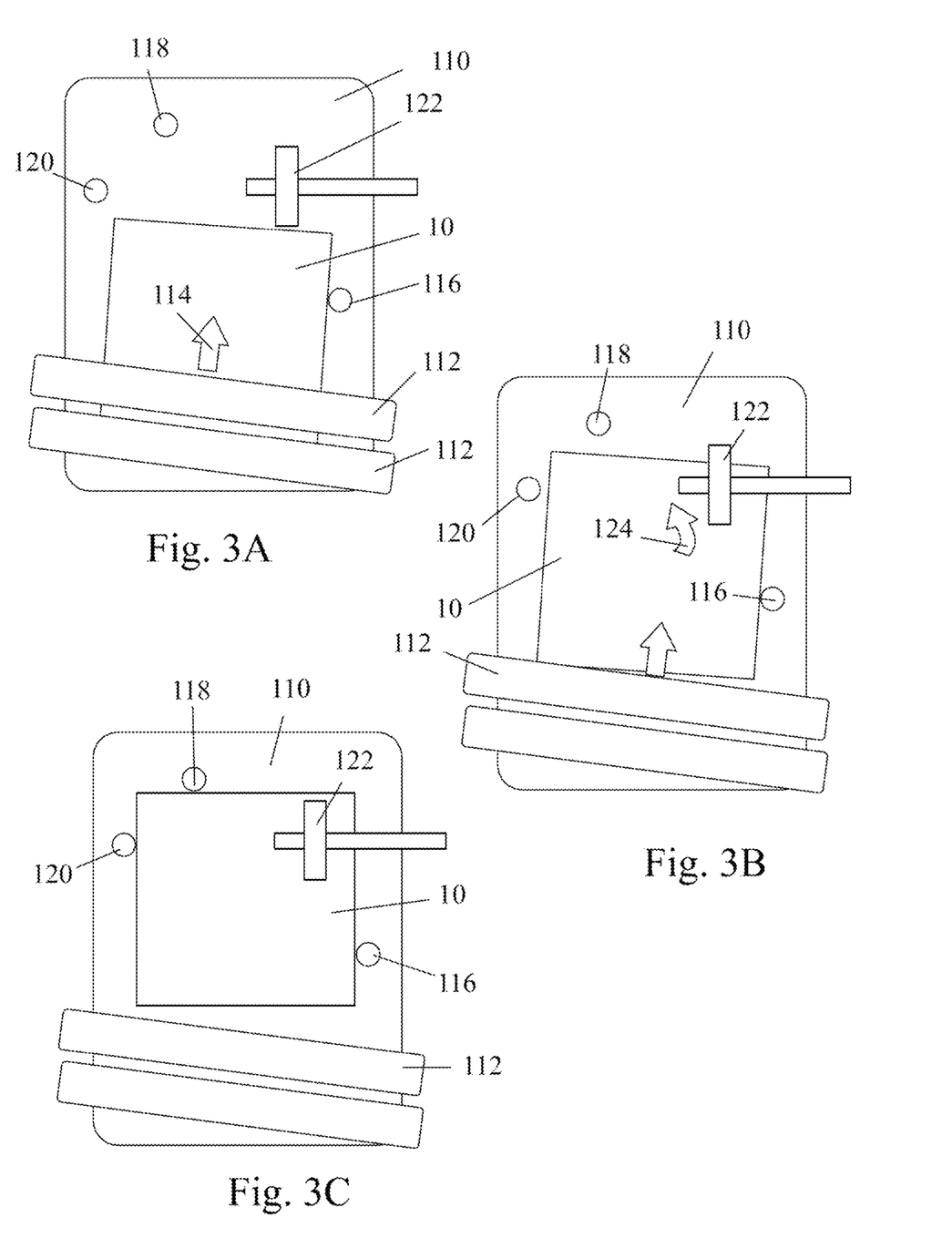
FIGS. 3A to 3C show three different plan view of an alignment device, that forms part of the substrate drive mechanism and ensures correct orientation of the substrates as they are fed to the nip, the alignment device being shown at three different stages of its operation in the three views.

The alignment can be performed using a device shown in more detail in FIGS. 3A to 3C. The device comprises a plate 110 that may itself be a hot plate intended to heat the substrate 10 by conduction. Two rollers 112 (there may be only one roller or more than two) located above the plate 110, and inclined relative to the length of the conveyor, to frictionally engage a substrate 10 and drive it in the direction of the arrow 114 until its right edge, as viewed, comes into contact with one of three pins 116, 118 and 120, of which at least the pin 118 is retractable. This is the state shown in FIG. 3A.

The rollers 112 continue to push the substrate 10 forwards while its right-hand edge remains in contact with the pin 116 until its leading end is engaged by a drive wheel 122. The axis of rotation of the wheel 122 is parallel to the nip 40 to ensure that the substrate 10 is driven towards the nip 40 with it leading edge parallel to the nip. The effect of two frictional forces acting on the substrate 10 at the same time but in different directions is to apply a torque, represented by the arrow 124 in FIG. 3B, tending to rotate the substrate counter-clockwise, as viewed, while its right-hand edge remains in contact with the pin 116. This will now first bring the left-hand edge into contact with pin 120 and continued drive by the wheel 122 will force the leading edge of the substrate against the pin retractable 118. By virtue of contact with three pins 116, 118 and 120 at the same time, as illustrated in FIG. 3C, the device ensures both the correct location of the substrate along the width of the nip 40 and also the correct orientation of the substrate relative to the nip. At a time when it is separately determined (as described below) that a pattern of composition is ready to be transferred to the substrate at the nip 40, the pin 118 is retracted and the wheel 122 advances the substrate 10 towards the nip 40.

While in the above exemplary embodiment of an alignment device, the aligning elements were described as abutments, more specifically as pins stationed around three edges of the substrate, this should not be construed as limiting. For instance, oblique conveyer stripes may drive the substrate toward a fixed lateral wall, forming a first abutment, an additional pin forming a second abutment for the leading edge of the substrate. In another instance, a centering conveyer such as the SOLTB-Z centering conveyer produced by Montech® AG may be used to perform the alignment.

The Web

The web 14 is made of a flexible material into which grooves are formed by any of a variety of possible processes. The grooves, of which the geometry is complementary to that of the desired conductors, are filled with a composition that contains electrically conductive particles, for example of silver, and a thermally activated adhesive. As mentioned, for certain types of relatively flat conductive patterns, such as back electrodes of solar cells and ground planes of PCBs' ground planes, the composition can alternatively be positioned on the surface of the web. In the present context, it suffices to know that the web carries patterns of the composition matching the desired conductors to be applied to the substrate but the interested reader will find in WO 2018/020479 more detail of the type of material from which the web can be made, the manner in which the grooves can be made, and the chemical structure of the components of the composition. It should be mentioned that the composition is not itself conductive but becomes conductive once sintered.

For the present purpose, it can be briefly noted that the web is sufficiently non-elastic to maintain the contour of the grooves (and patterns) and the shape of the compositions to be transferred therefrom. On the other hand, the web has enough elasticity (e.g., stretchability) so as to facilitate registration of patterns carried thereon with the substrate by way of dancers and tensioning, such dancers also referred to herein as a tension control mechanism. The web is preferably flexible enough to conform to the surface of the substrate, so as to permit a sufficiently intimate contact for transfer of the composition lines. Other desirable properties can be readily understood, so as to render the web compatible with the process implemented by the apparatus (e.g., stress resistant, heat resistant, heat conductive or dissipative, and the like) and with the compositions used therein (e.g., chemically resistant, chemically inert, etc.)

As mentioned above, to the extent that the apparatus is used to synchronously transfer a first pattern of a first composition from a surface of a first flexible web and a second pattern of a second composition from a surface of a second flexible web respectively to a first and a second surface of the substrate, the first and second patterns (and/or their respective compositions, and/or the method of pattern preparation for the first and second patterns, etc.) can be similar to one another or can differ from one another. For instance, the first web can include the characteristics of the membrane detailed, inter alia, in WO 2018/020479, and the first pattern can be prepared as detailed, inter alia, in WO 2018/020479. In contrast, the second web can have different characteristics and/or the second pattern can be prepared differently, e.g., by any known method.

It is further noted that in some embodiments the first and second patterns need not be simultaneously formed on the substrate, regardless of whether the patterns, webs, and/or methods of pattern preparation are respectively similar to one another or differ from one another. For example, a first pattern, web and method of pattern preparation may be as described inter alia, in WO 2018/020479, and the first pattern may be formed on the substrate by the apparatus detailed herein. A second pattern may be formed on the substrate by the same apparatus or by a different apparatus, either before or the first pattern is formed on the substrate.

The Pressure Rollers

The purpose of the pressure roller(s) is to press the web 14 against the substrate. A force is applied to the pressure roller 22 to apply a compressive force at the nip 40, the magnitude of the force depending on the nature of the web and the substrate. The pressure roller may be made of any suitable material, for instance of a rubber or of steel but coated with a thin layer of a compliant material to ensure good contact over the entire surface area of the web.

In some embodiments, pressure roller 22 is coated with a material (e.g., a polymeric compound or blend) so as to provide on its outer surface a hardness of no more than 70 Shore A, no more than 60 Shore A, no more than 50 Shore A, or no more than 40 Shore A. In some embodiments, pressure rollers 22, if coated, has an outer surface hardness of at least 10 Shore 00, at least 30 Shore 00, at least 50 Shore 00 (which approximately correspond to 10 Shore A), at least 20 Shore A, or at least 30 Shore A.

While not being limited to any particular substrate that may desirably be fed to the nip, the present apparatus can be highly suitable for substrates that are relatively fragile and/or relatively brittle (such as glass and ceramics), and/or relatively thin (e.g., having a thickness of 500 µm or less, 400 µm or less, 300 µm or less, or 200 µm or less). Such substrates (e.g., solar cell wafers) are particularly sensitive to manufacturing conditions and may readily break under conditions that are acceptable for more robust and/or thicker substrates (which conditions may prevail in some conventional apparatus).

As mentioned, in some embodiments, when heating is not exclusively performed on the substrate, the pressure roller can additionally serve as a heating cylinder.

The Dancer

It is important to ensure that when the patterns on the web 14 arrive at the nip 40, they are synchronized with the arrival of the substrates. The patterns of composition are spaced on the web so that blank web may pass through the nip 40 while a fresh substrate is being heated and oriented for presentation to the nip. A problem arises in because the web is driven continuously whereas the presentation of substrates to the nip 40 is intermittent, the arrival time of the patterns at the nip may not coincide with the presence of a substrate in the nip.

To avoid this problem, the web is pulled from the supply roll 16 by rotation of the take-up roll 32. A sensor 70 is provided to detect the arrival of patterns at a certain position as the web comes away from the supply roll 16. If the expected arrival time of the pattern at the nip 40 does not coincide with the next arrival of a substrate 10 at the nip 40, then the movement of the dancer 20 can vary the length of the path of the web from the supply roll 16 to the nip 40, which has the effect of increasing or decreasing the time taken for the sensed pattern to reach the nip 40. Thus, controlling of the dancer 20 in dependence upon the time that a pattern is sensed by sensor 70 and the time that a substrate 10 is released by retracting the pin 118, it is possible to ensure correct registration between the patterns and the substrates. If patterns on opposite surfaces of a substrate are both correctly in register with the substrate then they will also be in correct register with one another.

The Cooling Station

The cooling of the web 14 after it has passed through the nip 40 is carried out in the illustrated embodiment by means of conduction. An endless cooling belt 24 made of a silicone material passes the nip 40 between the roller 22 and the web 14 and may serve as the compliant layer mentioned above. The belt 24 also passes between the web and a second roller 26 and is maintained in tension by an idler roller 28. In this way, the cooling belt 24 is maintained in thermal contact with the web over the entire run extending from the pressure roller 22 to the roller 26. As the cooling belt may be in motion, such alternative, wherein the heat dissipation is achieved via a circulating object, can be viewed as a "dynamic" heat exchanger.

The cooling belt 24 is exposed to ambient air over the remainder of its length and may not need additional cooling. Should there be a need to cool the belt 24, a blower may be provided for blowing air onto it, the air being preferably, but not necessarily, cooled.

As an alternative, it would be possible to dispense with the cooling belt 24 and to cool the web by blowing air onto it directly. The air may, if necessary be cooled, such as by means of a refrigeration circuit, to a temperature not exceeding 20° C.

In an alternative embodiment, the cooling of the substrate and the web can be achieved by contacting a "static" heat sink (e.g., a conventional heat exchanger passively or actively refrigerated by a fluid, and optionally including a number of fins to facilitate heat dissipation). As in the case of the circulating cooling belt, the web and/or the substrate may be maintained in thermal contact with the heat sink by way of one or more rollers urging such contact. In some embodiments, the roller(s) ensuring thermal contact with the heat sink may additionally act as a portion thereof. For instance, such rollers may be cooled (e.g., liquid cooled).

While passing through the cooling station 23, the web 14 remains attached to the substrate(s) 10 but as the web cools, the adhesion of the composition to the web decreases and/or conversely the adhesion of the composition to the substrate increases, such changes in relative adhesivity to respective source and target surface assisting in the subsequent separation of the web from the substrates.

As mentioned, the temperature of the web and/or the substrate upon exit of the cooling station can be selected or adapted to the web being used, the composition being transferred and the substrate to which the composition is to adhere. In some embodiments, the temperature of the web when reaching the separation device is 60° C. or less, 50° C. or less, or 40° C. or less.

The Separation Device

The separation device 30 illustrated in the exemplary embodiment of the depicted apparatus comprises a metal plate that is bent to define an acute angle. The web on its return path to the take-up roller 32 is bent over the sharp edge defined by the outer sides of the bent metal plate. This action peels the web 14 away from the substrate 10 leaving the composition adhering to the substrate 10. A skilled person will readily appreciate that alternative separation devices can satisfactorily achieve similar peeling of the web.

Further Treatment of the Substrates

Though not needed for the transfer of the composition to the substrate, the apparatus may comprise further stations for processing the substrate after transfer of the composition. A first station may be provided to apply energy, such as heat to the substrate, to cause the composition to become conductive. In cases where the substrate is a semiconductor, a further processing station may be provided for fusing the sintered conductors with the semiconductor substrate to reduce contact resistance. In other instances, the substrate may need to be cut or coated, and any such processing may be integrated with the apparatus of the present disclosure to enable the substrates to perform their final function upon discharge from the apparatus.

In the description and claims of the present disclosure, each of the verbs, "comprise" "include" and "have", and conjugates thereof, are used to indicate that the object or objects of the verb are not necessarily a complete listing of members, components, elements, steps or parts of the subject or subjects of the verb.

As used herein, the singular form "a", "an" and "the" include plural references and mean "at least one" or "one or more" unless the context clearly dictates otherwise.

Positional or motional terms such as "upper", "lower", "right", "left", "bottom", "below", "lowered", "low", "top", "above", "elevated", "high", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, the use of the expression "and/or" between the last two members of a list of options for selection indicates that a selection of one or more of the listed options is appropriate and may be made.

Unless otherwise stated, when the outer bounds of a range with respect to a feature of an embodiment of the present technology are noted in the disclosure, it should be understood that in the embodiment, the possible values of the feature may include the noted outer bounds as well as values in between the noted outer bounds.

In the disclosure, unless otherwise stated, adjectives such as "substantially", "approximately" and "about" that modify a condition or relationship characteristic of a feature or features of an embodiment of the present technology, are to be understood to mean that the condition or characteristic is defined to within tolerances that are acceptable for operation of the embodiment for an application for which it is intended, or within variations expected from the measurement being performed and/or from the measuring instrument being used. Furthermore, unless otherwise stated the terms (e.g., numbers) used in this disclosure, even without such adjectives, should be construed as having tolerances which may depart from the precise meaning of the relevant term but would enable the invention or the relevant portion thereof to operate and function as described, and as understood by a person skilled in the art.

Certain marks referenced herein may be common law or registered trademarks of third parties. Use of these marks is by way of example and shall not be construed as descriptive or limit the scope of this disclosure to material associated only with such marks.

While this disclosure has been described in terms of certain embodiments and generally associated methods, alterations and permutations of the embodiments and methods will be apparent to those skilled in the art. The present disclosure is to be understood as not limited by the specific examples described herein.

The invention claimed is:

1. A method for transferring a pattern of a composition containing particles of an electrically conductive material and an adhesive from a surface of a flexible web to a surface of a substrate, the method comprising:
   i. providing a flexible web, the web comprising a plurality of repeated patterns each constituted of a) a first pattern of a first composition containing particles of a first electrically conductive material and a first adhesive, the first pattern of the first composition being disposed within a web surface, and b) a second pattern of a second composition, the second pattern of the second composition being disposed on the web surface;
   ii. providing a substrate having a substrate surface;
   iii. advancing the web and the substrate by respective drive mechanisms to a nip through which the web and the substrate pass at the same time, the nip including a pressure roller serving to press the web surface and the substrate surface against one another during passage through the nip;

iv. heating at least one of the web and the substrate prior to, or during, passage through the nip, to a temperature at which the adhesive in the composition is activated when the surfaces are in contact with one another so as to adhere at least one of the repeated patterns to the surface of the substrate; and v. cooling the web and/or the substrate after passage through the nip.

2. The method of claim 1, further comprising peeling the web away from the substrate after the cooling of the web, to leave the pattern of composition adhered to the surface of the substrate.

3. The method of claim 2, wherein the drive mechanism for the web comprises a web supply roll, a web take-up roll and drive rollers for continuously driving the web from the supply roll to the take-up roll via the nip, the web being disposable.

4. The method of claim 3, wherein the drive mechanism for the web further comprises a web guide to inhibit lateral movement of the web so as to maintain the web aligned with the substrate.

5. The method of claim 3, wherein the drive mechanism for the web includes a sensor for detecting the position of repeated patterns on the web and a dancer roller to enable the speed and/or tension of the web relative to the nip to be increased or decreased, in order to ensure correct positioning of each pattern relative to reference edges of the surface of the substrate during the passage through the nip.

6. The method of claim 1, wherein the drive mechanism for the substrate comprises a stack of substrates and an indexing mechanism for feeding substrates individually from the stack to the nip in synchronism with the movement of the web.

7. The method of claim 6, wherein the substrate indexing mechanism comprises an alignment device with abutments for ensuring correct alignment of edges of the substrate along mutually orthogonal axes.

8. The method of claim 6, wherein the substrate indexing mechanism includes an analyzer for detecting defects in substrates drawn from the stack and an ejector for rejecting substrates found to contain defects.

9. The method of claim 1, wherein only the substrate is heated.

10. The method of claim 1, wherein the substrate is heated to a first temperature prior to passage through the nip and the nip is heated to a second temperature.

11. The method of claim 1, wherein the web is cooled after passage through the nip by thermal contact with a heat sink or a circulating endless cooling belt; or by an air blower.

12. The method of claim 1, wherein the second composition contains particles of a second electrically conductive material and a second adhesive, the second composition being same or different as the first composition.

13. The method of claim 1, wherein the web surface including the first pattern and supporting the second pattern is made of a formable thermoplastic polymer.

14. The method of claim 13, wherein the first pattern is formed within the web surface prior to providing the flexible web, the formation of the first pattern including forming a pattern of grooves corresponding at least partially to the first pattern, loading the grooves in one or more filling cycle(s) such that on completion of loading the first composition is dry, substantially fills the grooves and levels with the web surface, and parts of the web surface between the grooves are substantially devoid of the first composition.

15. The method of claim 14, wherein the pattern of grooves is formed by casting or embossing the formable thermoplastic polymer.

16. The method of claim 14, wherein the second pattern is formed on the web surface after the formation of the first pattern and prior to providing the flexible web, the formation of the second pattern including depositing the second composition on the web surface in accordance with the second pattern, said deposition at least partially covering the first pattern, and drying the second pattern of the second composition.

17. The method of claim 1, further comprising applying sufficient energy to sinter the electrically conductive material and render electrically conductive the composition transferred to the substrate.

18. The method of claim 1, wherein the web is a first web, the nip through which the first web and the substrate pass at the same time being a first nip, the method further comprising:

i. providing a second flexible web, the second web having on or within a surface of the second web a third pattern of a third composition containing particles of a third electrically conductive material and a third adhesive;

ii. advancing the second web and the substrate by respective drive mechanisms to a second nip through which the second web and the substrate pass at the same time, the second nip including a pressure roller serving to press the surface of the second web and a second surface of the substrate opposite the surface against which the first web was pressed, the surfaces being pressed one against the other during passage through the second nip;

iii. heating at least one of the second web and the substrate prior to, or during, passage through the second nip, to a temperature at which the third adhesive in the third composition is activated when the surfaces are in contact with one another; and iv. cooling the second web and/or the substrate after passage through the second nip.

19. The method of claim 18, wherein at least one of the following is fulfilled:

a—the second web differs from the first web;

b—the third pattern differs from the repeated pattern;

c—the particles of the third electrically conductive material differ from the particles of the first electrically conductive material and/or from the particles of a second electrically conductive material;

d—the third adhesive differs from the first adhesive and/or from a second adhesive;

e—the third composition differs from the first and/or second composition; and f—the second nip differs from the first nip.

20. The method of claim 19, further comprising peeling at least one of the first web and the second web away from the substrate respective surface after the cooling of the respective web, to leave at least one of the repeated patterns of the composition and the third pattern of the third composition adhered to the substrate.

21. The method of claim 19, wherein the first nip and the second nip are one and the same, the method serving to apply respective patterns of respective compositions at the same time to opposite surfaces of the substrate, the nip being defined between two pressure rollers each serving to press a respective one of the webs against a respective surface of the substrate, the pressure rollers being symmetrical.

* * * * *